(12) United States Patent  (10) Patent No.: US 7,551,438 B2
Seki  (45) Date of Patent: Jun. 23, 2009

(54) INFORMATION PROCESSING BLADE AND INFORMATION PROCESSING APPARATUS USING THE SAME

(75) Inventor: Hideki Seki, Tokyo (JP)

(73) Assignee: NEC Corporation (JP)

( * ) Notice: Subject to any disclaimer, the term of this patent is extended or adjusted under 35 U.S.C. 154(b) by 266 days.

(21) Appl. No.: 11/278,204

(22) Filed: Mar. 31, 2006

(65) Prior Publication Data
US 2006/0221560 A1   Oct. 5, 2006

(30) Foreign Application Priority Data
Mar. 31, 2005   (JP) .............................. 2005-105087

(51) Int. Cl.
*H05K 7/20* (2006.01)
*F28F 7/00* (2006.01)
*H01L 23/34* (2006.01)

(52) U.S. Cl. ...................... 361/699; 165/80.4; 361/719; 257/719

(58) Field of Classification Search .................. 361/699
See application file for complete search history.

(56) References Cited

U.S. PATENT DOCUMENTS

| | | | | |
|---|---|---|---|---|
| 4,825,337 A | * | 4/1989 | Karpman | .................... 361/716 |
| 5,640,302 A | * | 6/1997 | Kikinis | ........................ 361/687 |
| 6,111,870 A | | 8/2000 | Kurtz | .......................... 370/344 |
| 6,393,853 B1 | * | 5/2002 | Vukovic et al. | ............ 62/259.2 |
| 6,404,640 B1 | * | 6/2002 | Ishimine et al. | ............. 361/720 |
| 6,621,707 B2 | * | 9/2003 | Ishimine et al. | ............. 361/721 |
| 6,693,797 B2 | * | 2/2004 | Faneuf et al. | ................ 361/689 |
| 6,776,221 B2 | * | 8/2004 | Montgomery et al. | ......... 165/46 |
| 6,853,554 B2 | * | 2/2005 | Bash et al. | ................... 361/699 |
| 7,042,726 B2 | * | 5/2006 | Cader et al. | ................. 361/699 |
| 7,203,063 B2 | * | 4/2007 | Bash et al. | ................... 361/699 |
| 7,212,409 B1 | * | 5/2007 | Belady et al. | ............... 361/721 |
| 7,339,793 B2 | * | 3/2008 | Foster et al. | ................ 361/721 |

FOREIGN PATENT DOCUMENTS

| | | |
|---|---|---|
| JP | 7-42515 | 8/1995 |
| JP | 8139481 | 5/1996 |
| JP | 9-129790 | 5/1997 |
| JP | 11121959 | 4/1999 |
| JP | 2001-332674 | 11/2001 |
| JP | 2004236343 | 8/2004 |

* cited by examiner

*Primary Examiner*—Gregory D Thompson
(74) *Attorney, Agent, or Firm*—Hayes Soloway P.C.

(57) ABSTRACT

An information processing blade computer includes a board having a blade structure such that the board is stored in a main body of an information processing apparatus; a part contained in a circuit which is mounted on the board to execute an process, wherein heat is generated during an operation of the part; and a holding mechanism provided to detachably hold a heat exchange section on the part for heat exchange with the part.

17 Claims, 8 Drawing Sheets

Fig. 8

INFORMATION PROCESSING BLADE AND INFORMATION PROCESSING APPARATUS USING THE SAME

BACKGROUND OF THE INVENTION

1. Field of the Invention

The present invention relates to an information processing blade and an information processing apparatus using the same, and in particular, relates to an information processing blade in which temperature control of parts is easy.

2. Description of the Related Art

In an information processing apparatus, a water-cooling system is known as a method of cooling a semiconductor chip such as a CPU for information processing. The water-cooling system is achieved by fixing a water-cooling head inside the information processing apparatus with such a fixture as a screw, for the semiconductor chip fixed in advance in the information processing apparatus.

On the other hand, in the information processing apparatus, a computer of a blade structure is known in which components necessary for a computer are mounted on a single printed circuit board. The computer blade has an information processing function, and is provided with chips such as a microprocessor (CPU) and a memory and a hard disk unit. The blade computer is mainly inserted into one of slots for blades provided for a main body of the information processing apparatus. At this time, the main body of the information processing apparatus carries out power supply to the blade, operation control of the blade computer, and so on. A blade personal computer and a blade server are known as the information processing apparatus using blade computers.

The blade computers are inserted in and pulled out from the slots for blade computers according to need. Therefore, a water-cooling head of a cooling unit provided to the main body of the information processing apparatus cannot be fixed on a chip when the chip on the blade computer should be water-cooled. Thus, only air-cooling by a fan fixed on the blade computer is possible. The blade computer is restricted in its height and size. That is to say, cooling capacity is limited. Therefore, in case of the air-cooling by the fan, there is a possibility that kinds of chips provided for a blade computer are limited, and it is possibly difficult to configure a server having a larger number of blade computers.

In conjunction with the above description, Japanese Laid Open Patent Publication (JP-P2004-326343A) discloses a liquid-cooling device. The liquid-cooling device has a heating unit, a heat receiving unit, a heat radiation section, a circulation section, and an airflow generating section. The heating unit is housed in a main body. The heat receiving unit receives heat generated in the heating unit. The heat radiation section radiates the heat transferred from the heat receiving unit based on circulation of a heat transfer medium. The circulation section circulates the heat transfer medium by connecting the heat receiving unit and the heat radiation section. The airflow generating section generates an airflow that passes through a plurality of cooled sections including the heat radiation section.

Also, Japanese Laid Open Patent Publication (JP-A-Heisei 8-139481) discloses a cooling device for electronic devices. The cooling device for electronic devices is provided with a planar heat pipe, a cooling plate, and a tapered member. The planar heat pipe is mounted to a plurality of printed circuit boards arranged approximately in parallel and adjacently to cover each printed circuit board. The cooling plate is provided close to a heat radiation section of each heat pipe. The tapered member is provided movably between the cooling plates and is formed to have a less diameter gradually toward a moving direction. The tapered member is used to press and closely attach the radiation section of the heat pipe to the cooling plate, by moving the tapered member into the moving direction.

Also, Japanese Laid Open Patent Publication (JP-A-Heisei 11-121959) discloses a cooling device. This cooling device for cooling electronic parts has a housing unit, a heat conduction plate, a heat conduction mat, and a mat holding member. The housing unit houses an electronic part to be detachable from a front side. The heat conduction plate is fixed to a back board substrate or sidewall of the housing unit. At the same time, the heat conduction plate in which a heat pipe is buried is provided apart from the electronic part and opposes to the electronic part. The heat conduction mat is arranged on the surface of the heat conduction plate on the side of the electronic part being arranged. The mat holding member increases the thickness of the heat conduction mat to the direction of the electronic part being arranged, by pressing an end of the heat conduction mat.

SUMMARY OF THE INVENTION

Therefore, an object of the present invention is to provide an information processing blade computer and an information processing apparatus which can carry out temperature control of parts in a blade computer without being affected by replacement of the blade computer.

Another object of the present invention is to provide an information processing blade computer and an information processing apparatus which can use a water cooling method for cooling of a semiconductor chip in a blade computer without any influence of replacement of blade computers, in an information processing apparatus with a blade structure.

In an aspect of the present invention, an information processing blade computer includes a board having a blade structure such that the board is stored in a main body of an information processing apparatus; a part contained in a circuit which is mounted on the board to execute an process, wherein heat is generated during an operation of the part; and a holding mechanism provided to detachably hold a heat exchange section on the part for heat exchange with the part.

Here, the part may be a semiconductor chip for the process.

Also, the holding mechanism may include a holding section operated to separate the heat exchange section from the part and contact the heat exchange section with the part; and a hold control section configured to control the holding section.

In this case, the holding section may include a pushing section configured to push the heat exchange section on the part, and the hold control section controls the pushing section to push the forcing section on the part.

Also, the information processing blade computer may further include a control unit which permits supply of power to the circuit when the heat exchange section is held on the part.

Also, the information processing blade computer may further include a control unit permits supply of power to the circuit when the heat exchange section is held on the part.

Also, in another aspect of the present invention, an information processing apparatus includes an information processing blade computer; a main body configured to store the information processing blade computer; a heat exchange section through which a heat medium flows; a first pipe supported by the main body, and connected to the heat exchange section to supply the heat medium to the heat exchange section; and a second pipe supported by the main body, and connected to the heat exchange section to receive the heat medium from the heat exchange section. The information processing blade computer includes a board having a blade structure; a part contained in a circuit which is mounted on the board to execute an process, wherein heat is generated during an operation of the part; and a holding mechanism provided to detachably hold the heat exchange section on the part for heat exchange with the part. The first and second pipes are supported by the main body such that the heat exchange section comes to the part.

Also, the information processing apparatus may further include a radiating section connected with the first and second pipes and configured to irradiate heat of the heat medium and to supply to the heat exchange section the heat medium from which the heat is irradiated.

Also, the part is a semiconductor chip for the process.

Also, the holding mechanism includes a holding section operated to separate the heat exchange section from the part and contact the heat exchange section with the part; and a hold control section configured to control the holding section.

In this case, the holding section comprises a pushing section configured to push the heat exchange section on the part, and the hold control section controls the pushing section to push the forcing section on the part.

Also, the information processing apparatus may further include a guide section configured to guide the heat exchange section onto the part.

Also, the information processing apparatus may further include a control unit which permits supply of power to the circuit when the heat exchange section is held on the part.

Also, in another aspect of the present invention, a method of cooling a part of a circuit in an information processing blade computer, is achieved by supporting a heat exchange section by first and second pipes, wherein heat medium flows through the heat exchange section, the heat medium is supplied to the heat exchange section through the first pipe, and the heat medium is supplied from the heat exchange section through the second pipe; by storing the information processing blade computer in a main body; by guiding the heat exchange section on the part while the information processing blade computer is stored in the main body; and by holding the heat exchange section on the part for heat exchange with the part.

Also, the method may be achieved by further radiating heat of the heat medium; and supplying to the heat exchange section the heat medium from which the heat is irradiated.

Also, the method may be achieved by further permitting supply of power to the circuit when the heat exchange section is held on the part.

Also, the method may be achieved by further stopping the supply of power to the circuit when the heat exchange section is separated from the part.

DESCRIPTION OF THE PREFERRED EMBODIMENTS

Hereinafter, an information processing blade computer of the present invention will be described in detail with reference to the attached drawings.

Figure 1:
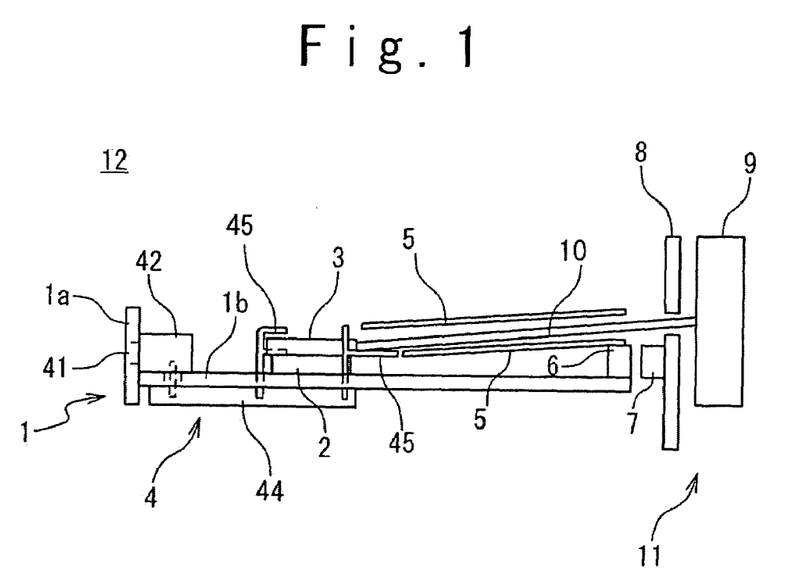
FIG. 1 is a schematic view showing a structure of an embodiment of an information processing blade computer and an information processing apparatus of the present invention.
Figure 2:
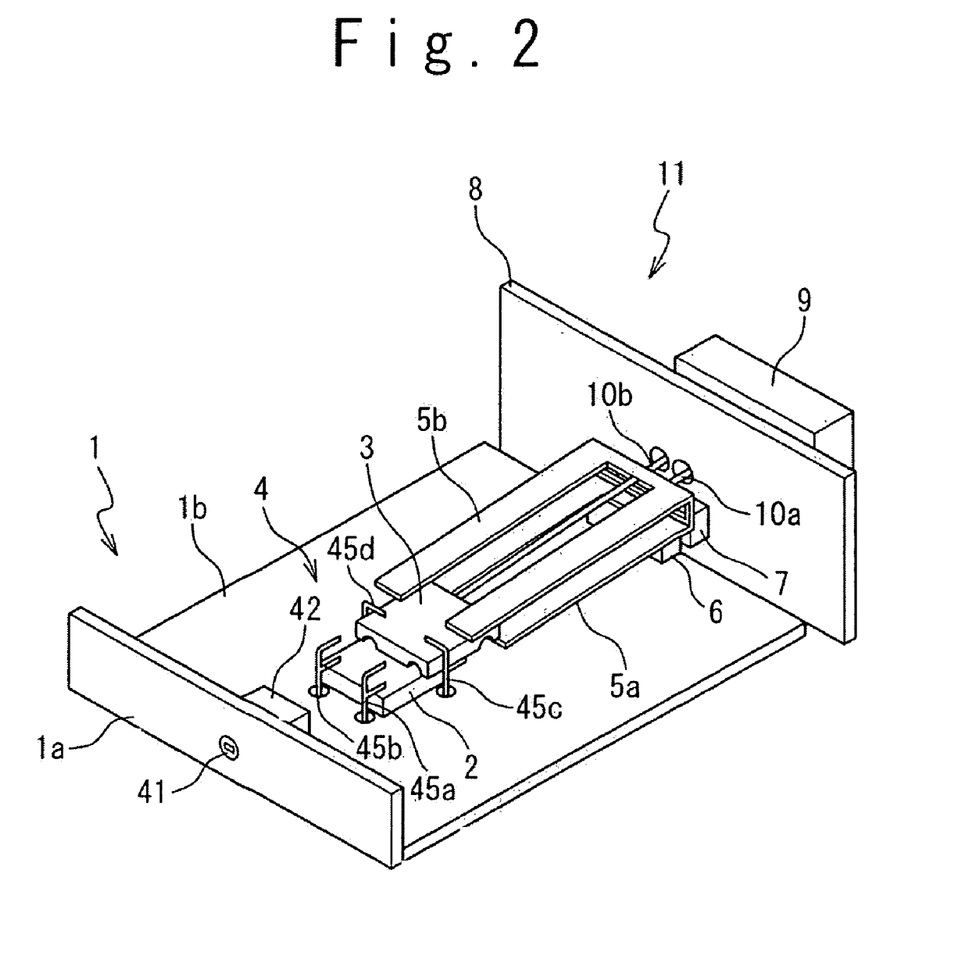
FIG. 2 is a perspective view showing the structure of the embodiment of the information processing blade computer and the information processing apparatus of the present invention.

FIG. 1 is a schematic view showing a structure of an information processing blade computer according to an embodiment of the present invention. FIG. 2 is a perspective view showing the structure of the information processing blade computer according to the embodiment of the present invention. An information processing blade computer 12 is provided with a blade 1 and a main body 11.

The information processing blade 1 has a blade structure in which components necessary for a computer are mounted on a printed circuit board 1b. The information processing blade 1 is provided with an information processing function, and has a front panel 1a, a CPU 2, a water-cooling head fixing mechanism 4, a guide 5, and a connector 6 in addition to the printed circuit board 1b. The printed circuit board 1b is provided with a circuit (not shown) to realize the information processing function of the information processing blade 1. The circuit has components necessary for a computer that includes the CPU 2 and the connector 6. The printed circuit board 1b is also provided with the front panel 1a, the water-cooling head fixing mechanism 4, and the guide 5. The front panel 1a is connected approximately vertically to one side of the printed circuit board 1b. The front panel 1a is the front when the information processing blade 1 is inserted into a slot for the blade computer 12 in the information processing apparatus main body 11. The front panel 1a has an indicator lamp, a button, and a switch (they are not shown) relevant to the information processing function of the information processing blade 1. The CPU 2 is a semiconductor chip for information processing in the information processing blade 1.

The CPU 2 is a semiconductor chip for information processing in the information processing blade 1. The CPU 2 is included in the circuit provided on the printed circuit board 1b. The CPU 2 generates heat through performing the information processing function. Therefore, the CPU 2 is cooled by a water-cooling head 3 to be mentioned later. The water-cooling head fixing mechanism 4 can hold the water-cooling head 3 on the CPU 2 that is cooled by the water-cooling head 3. When holding the water-cooling head 3 on the CPU 2, the water-cooling head fixing mechanism 4 supplies power to the information processing blade 1 or the CPU 2. When the water-cooling head fixing mechanism 4 does not hold the water-cooling head 3 on the CPU 2, the water-cooling head fixing mechanism 4 stops the supply of power. The water-cooling head fixing mechanism 4 is provided with an operation switch 41, a control section 42, a fixing terminal driving section 44, and fixing terminals 45.

The fixing terminals 45 push the CPU 2 against the printed circuit board 1b at all times. At the same time, the fixing terminals 45 take either a first state or a second state. The fixing terminals 45 push the water-cooling head 3 to be closely fixed to the CPU 2 in the first state, and the fixing terminals 45 are detached from the water-cooling head 3 such that the water-cooling head 3 is movable in the second state. The fixing terminal driving section 44 drives the fixing terminals 45 to take either the first state or the second state. The control section 42 controls the fixing terminal driving section 44 such that the fixing terminals 45 takes either the first state or the second state, based on an operation of the operation switch 41. At the same time, the control section 42 supplies power to the information processing blade 1 or the CPU 2 in the first state. In the second state, the control section 42 stops the supply of power to the information processing blade 1 or the CPU 2. Thus, the operation switch 41 outputs either the first state or the second state, as a selected state of the fixing terminals 45, based on an operation by a user. Four fixing terminals 45a, 45b, 45c, and 45d are provided, as shown in FIG. 2.

The guide 5 is fixed on the connector 6, and extends from the connector 6 to the vicinity of the CPU 2. The guide 5 guides the water-cooling head 3 such that the head 3 slides and reaches the CPU 2. It is possible to easily move the water-cooling head 3 onto the CPU 2 without being interfered by other members or components on the printed circuit board 1b, by sliding the water-cooling head 3 through a region between the guide 5. The guide 5 may be better understood when described as an upper guide 5b and a lower guide 5a, as shown in FIG. 2. In FIGS. 1 and 2, lateral guides are not shown in the region between the upper guide 5b and the lower guide 5a. However, the lateral guides may be provided. In that case, the water-cooling head 3 can be guided onto the CPU 2 more accurately. The connector 6 is used for connection between the circuit on the printed circuit board 1b and an external circuit. The connector 6 is connected with a connector 7 that is mentioned later.

The main body 11 has at least one slot (not shown) for housing the information processing blade 1. The main body 11 is provided with the water-cooling head 3, a water passage 10 (10a and 10b), a back panel 8, and a water-cooling system 9. Water as a heat medium flows through the water-cooling head 3. The water-cooling head 3, when closely fixed to the CPU 2 by the fixing terminals 45, takes out heat from the CPU 2 by using the flowing water to decrease the temperature of the CPU 2. The water-cooling head 3 has the same structure as a cooling head in which heat exchange is easy in a well-known cooling system.

The water passage 10 includes water passages 10a and 10b. The water passage 10a is held by the information processing apparatus main body 11 (not shown), and one end of the water passage 10a is connected to the water-cooling head 3 and the other end thereof is connected to the water-cooling system 9. The water passage 10a receives cooled water from the water-cooling system 9, and supplies the received water to the water-cooling head 3. The water passage 10b is held by the information processing apparatus main body 11 (not shown), and one end of the water passage 10b is connected to the water-cooling head 3 and the other end thereof is connected to the water-cooling system 9. The water passage 10b receives warmed water from the water-cooling head 3, and sends the received water to the water-cooling system 9. The water passage 10 has given stiffness since the water passage 10 is provided with a function to support the water-cooling head 3. On the other hand, the water passage 10 also has flexibility for some degree of deformation such that the water-cooling head 3 can be closely attached to an upper surface of the CPU 2 by being pushed by the fixing terminals 45 even when a lower surface of the water-cooling head 3 is not parallel to the upper surface of the CPU 2. The water passage 10 is formed from a copper pipe and a resin pipe. The water-cooling system 9 receives water warmed from the water-cooling head 3 through the water passage 10b, cools the received water, and sends the cooled water back to the water-cooling head 3 through the water passage 10a. The water-cooling system 9 is a well-known cooling system having a pump for circulating cooling water, a radiator for cooling the cooling water, a tank for storing the cooling water, and so on. The water-cooling system 9, the water passage 10 connected thereto, and the water-cooling head 3, are independent, and are completely separated off from the information processing blade computer 1. Consequently, it is possible to fix the water-cooling head 3 after the information processing blade 1 is mounted to the information processing blade computer 12, and detach the water-cooling head 3 from the CPU 2 before the information processing blade 1 is taken out from the information processing blade computer 12. Therefore, there is no need to provide a cooling device to the information processing blade 1.

The back panel 8 is provided with a circuit having a function to perform power supply to the information processing blade 1 of the information processing blade computer 12 through the connector 7, a function to control an operation of the information processing blade 1, and so on.

Figure 3:
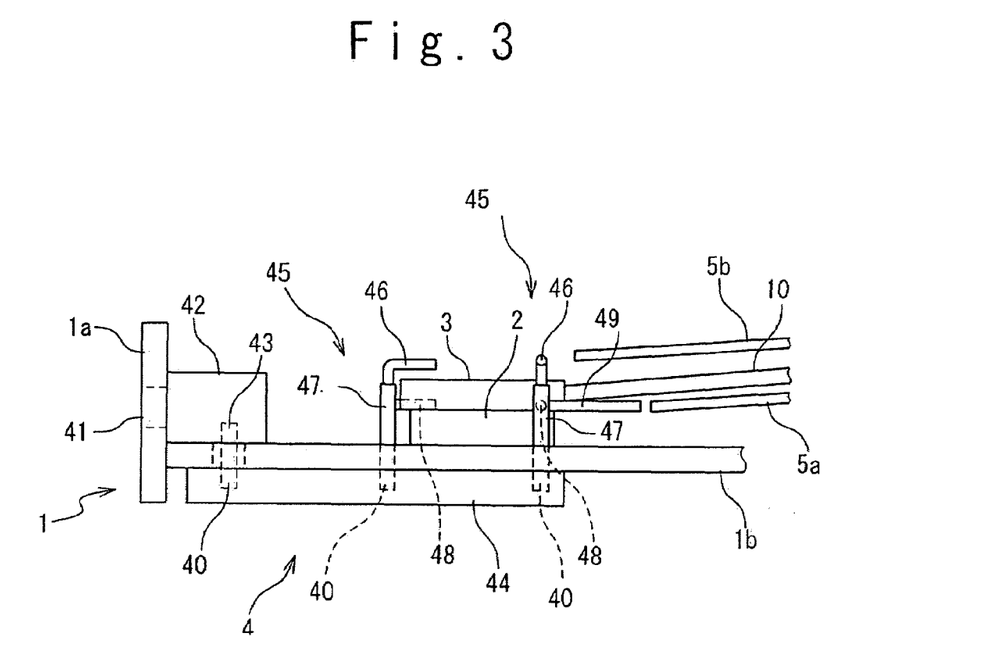
FIG. 3 is a partial side view showing details of a water-cooling head fixing mechanism in FIG. 1.

FIG. 3 is a partial side view showing details of the water-cooling head fixing mechanism 4 of the present invention shown in FIG. 1. The fixing terminals 45 push the CPU 2 against the printed circuit board 1b, and push or release the water-cooling head 3. The fixing terminals 45 have upper holding members 46, supporting members 47, and lower holding members 48 and 49.

The supporting members 47 are connected to the fixing terminal driving section 44 with connection sections 40 through the printed circuit board 1b. The supporting members 47 are provided to multiple positions around the periphery of the CPU 2 to be cooled, approximately vertically to the printed circuit board 1b. Here, supporting members 47 are provided in correspondence to the four fixing terminals 45, represented as fixing terminals 45a, 45b, 45c, and 45d in FIG. 2. The supporting members 47 hold the lower holding members 49 fixedly, and the lower holding member 48 and the upper holding member 46 movably. The lower holding members 48 extend from the supporting members 47 approximately vertically toward the upper surface of the CPU 2, and further extend in parallel to the upper surface of the CPU 2. The lower holding members 48 have elasticity, and float the water-cooling head 3 such that the water-cooling head 3 does not rub the CPU 2 when the information processing blade 1 is taken out. At this time, the lower holding members 48 may be connected to a driving mechanism (not shown) of the fixing terminal driving section 44. In that case, the lower holding members 48 take either a first state or a second state by the driving mechanism. The lower holding member 48 moves downward to be closely attached to the CPU 2 in the first state, and the lower holding member 48, when the information processing blade 1 is taken out, moves upward to float the water-cooling head 3 in the second state. The lower holding members 48 is made of metal used for spring. Here, lower holding members 48 are provided in correspondence to the four supporting members 47 which correspond to the four fixing terminals 45a, 45b, 45c, and 45d shown in FIG. 2. Movements of the four lower holding members 48 are linked.

The lower holding members 49 extend toward the direction of the guide 5 from the supporting member 47. When the water-cooling head 3 moves from the guide 5 toward the upper surface of the CPU 2, or when the water-cooling head 3 moves from the upper surface of the CPU 2 toward the guide 5, the lower holding member 49 supports the lower surface of the water-cooling head 3 between the guide 5 and the CPU 2. The lower holding member 49 is made of metal used for a spring. Here, the lower holding members 48 are provided in correspondence to the supporting members 47 on the side of the guide 5. The upper holding members 46 pass through the supporting members 47 and extend upward from the upper portion of the supporting members 47. The upper holding members 46 then extend toward the upper surface of the CPU 2 and extend in parallel to the upper surface of the CPU 2. The upper holding members 46 are connected to the driving mechanism (not shown) of the fixing terminal driving section 44 with the connection section 40. By the driving mechanism, the upper holding members 46 take either a first state or a second state. The upper holding members 46 move downward to push and closely fix the water-cooling head 3 in the first state, and the upper holding members 46 move upward and separate from the water-cooling head 3 to be movable in the second state. The upper holding members 46 are made of metal used for the spring. Here, upper holding members 46 are provided in correspondence to the supporting members 47 on the side of the guide 5. Movements of the four upper holding members 46 are linked.

The fixing terminal driving section 44 is combined to a back side of the printed circuit board 1b, and is also combined to the fixing terminals 45 (e.g. 45a, 45b, 45c, and 45d as shown in FIG. 2) with the connection sections 40 through the printed circuit board 1b. The fixing terminal driving section 44 has a driving mechanism (not shown). Based on the control of the control section 42, the driving mechanism drives the upper holding members 46 and the lower holding members 48 of the fixing terminals 45 (45a to 45d) to link the movements of the upper holding members 46 and the lower holding members 48, such that the upper holding member 46 and the lower holding members 48 take either the first state or the second state. The driving mechanism is exemplified by a mechanical mechanism that makes the upper holding members 46 and the lower holding members 48 move in correspondence to each other, to raise and lower the upper holding members 46 and the lower holding members 48 based on a control signal from the control section 42 (mentioned later), for example.

The control section 42 is combined onto the printed circuit board 1b, and is also combined to the fixing terminal driving section 44 with a connection section 40e through the printed circuit board 1b by a combining member 43. An electric interconnection between the control section 42 and the fixing terminal driving section 44 is provided in the combining member 43. Based on an operation of the operation switch 41, the control section 42 controls the driving mechanism of the fixing terminal driving section 44 through the interconnection by using a control signal, such that the fixing terminals 45 take either the first state or the second state. The control section 42 has a key mechanism and a slide mechanism, for example, selects the first state and the second state when being turned to a LOCK side and a FREE side, respectively.

The operation switch 41 takes either an A state where the first state is selected, or a B state where the second state is selected, based on a user's operation. In the A state, an operation to fix the fixing terminal 45 is selected. In the B state, an operation to detach the fixing terminal 45 is selected.

Figure 4:
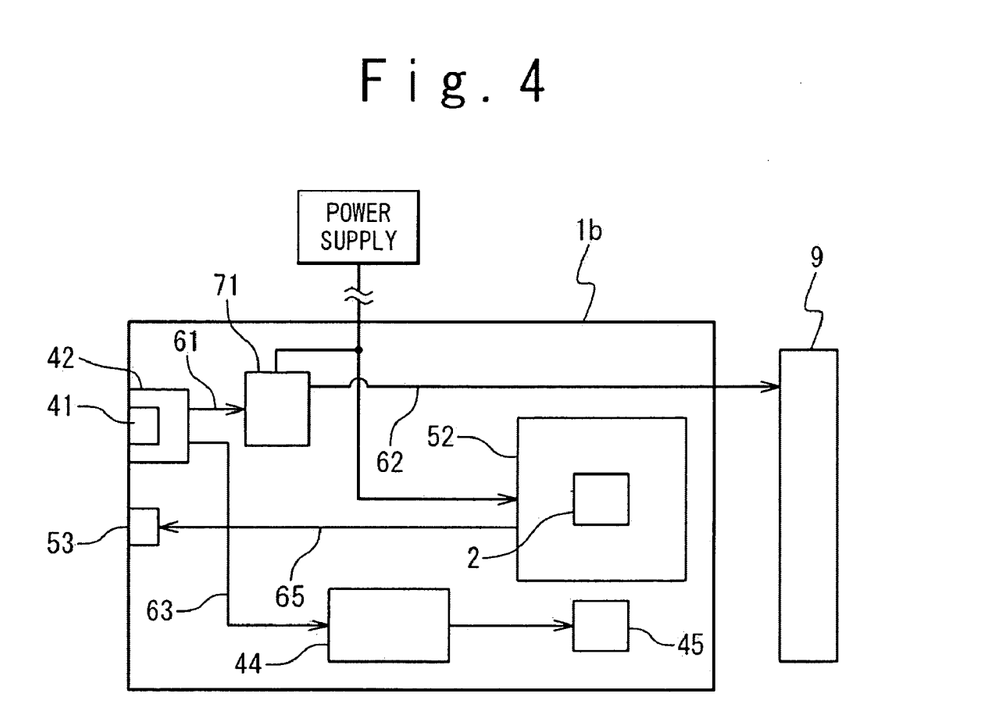
FIG. 4 is a block diagram showing a structure of an information processing blade computer in FIG. 1.

FIG. 4 is a block diagram showing the circuit configuration of the information processing blade 1 in FIG. 1. The control section 42 outputs a signal 63 to the fixing terminal driving section 44, and the signal 63 indicates either the A state or the B state based on the state of the operation switch 41. When the signal 63 indicates the A state, the fixing terminal driving section 44 lowers the fixing terminals 45. When the signal 63 indicates the B state, the fixing terminal driving section 44 raises the fixing terminals 45. Also, the control section 42 outputs a signal 61 to a power supply switch 71, and the signal 61 indicates either the A state or the B state based on the state of the operation switch 41. When the signal 61 indicates the A state, the power supply switch 71 is ON, power 62 is supplied from a power supply to the water-cooling system 9, and the water-cooling system 9 starts to operate. When the signal 61 indicates the B state, the power supply switch 71 is OFF, the power 62 from the power supply is suspended, and the operation of the water-cooling system 9 is stopped.

Additionally, when an OS operates and a circuit 52 operates, power is supplied to the circuit 52 including the CPU 2 on the printed circuit board 1b. In this case, an operation signal 65 is outputted from the circuit 52 to an operation LED 53, and the operation LED lights up. Supply of power to the circuit 52 is suspended when the OS is shut down and an information processing operation of the information processing blade 1 is ended. In that case, the operation signal 65 is stopped and the operation LED is turned off.

The fixing terminal driving section 44 raises the fixing terminals 45, when receiving the signal 63 for the operation to raise the fixing terminals 45. As a result, the water-cooling head 3 is movable. The fixing terminal driving section 44 lowers the fixing terminals 45, when receiving the signal 63 for the operation to lower the fixing terminal 45. As a result, the water-cooling head 3 is fixed onto the CPU 2.

Figure 5:
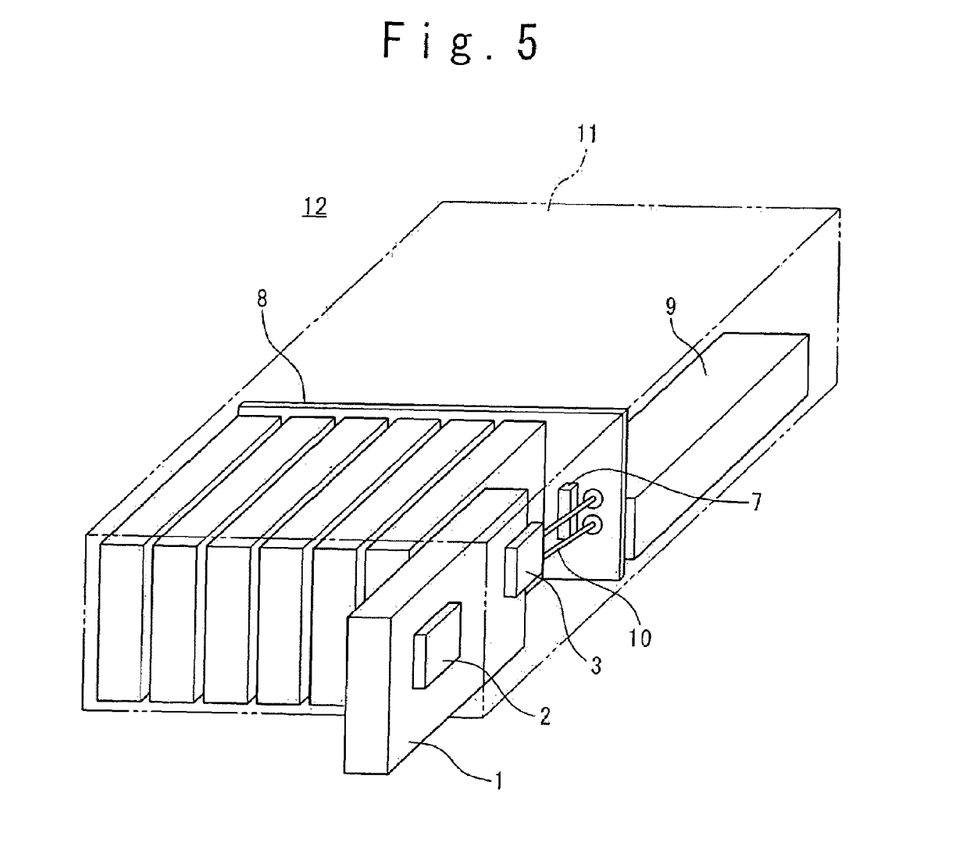
FIG. 5 of the perspective view showing the structure of the embodiment of the information processing apparatus of the present invention.

FIG. 5 is a perspective view showing the structure of the information processing apparatus according to the embodiment of the present invention. FIG. 5 shows the information processing blade computer 12 provided with a plurality of information apparatus 13. Each reference numeral is the same as that in FIGS. 1 and 2.

The information processing apparatus main body 11 has a plurality of slots (not shown) for housing the information processing blade computers 1. Each of the plurality of slots houses the information processing blade computer 1. The water-cooling head 3 is connected to one end of the water passage 10, and extends onto the CPU 2 of the information processing blade 1. The water-cooling system 9 is connected to the other end of the water passage 10, and is arranged in the information processing apparatus main body 11. The water-cooling system 9 is provided to each of the plurality of slots (however, only the rightmost water-cooling system is shown in FIG. 5 where the guide 5 is not shown). By providing the water-cooling system 9 in correspondence to the individual information processing blade 1, it becomes easy to perform management of every information processing blade 1 in the information processing apparatus 13.

Figure 6:
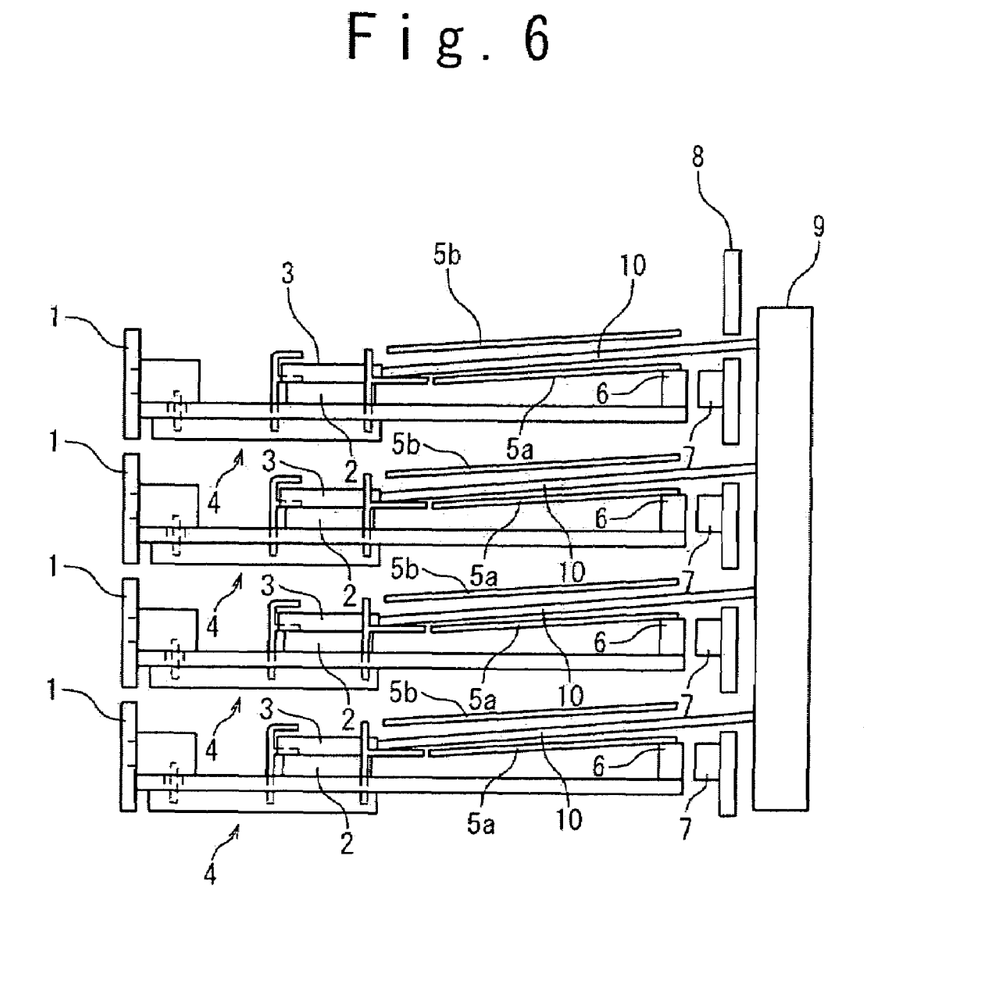
FIG. 6 is a side view showing the structure of the embodiment of the information processing apparatus of the present invention.

FIG. 6 is a side view showing the structure of the information processing apparatus according to the embodiment of the present invention. FIG. 6 shows the information processing apparatus 13 provided with a plurality of information processing blade computers 12 mentioned above. Each reference numeral is the same as that in FIGS. 1 and 2.

As shown in FIG. 6, the water-cooling system 9 may be shared by the plurality of information processing blade computers 12 housed in the plurality of slots. In this case, the water-cooling system 9 is structured to control an amount of water flowing through the water passage 10, for each water passage. Since only the single water-cooling system 9 is required, an occupied area can be reduced compared with the case where the water-cooling system 9 is provided individually.

Next, a method of inserting the information processing blade 1 into the information processing apparatus main body 11 of the present invention. FIGS. 7A to 7D are side views showing the method of inserting the information processing blade 1 into the information processing apparatus main body 11 of the present invention.

Figures 7A, 7B:
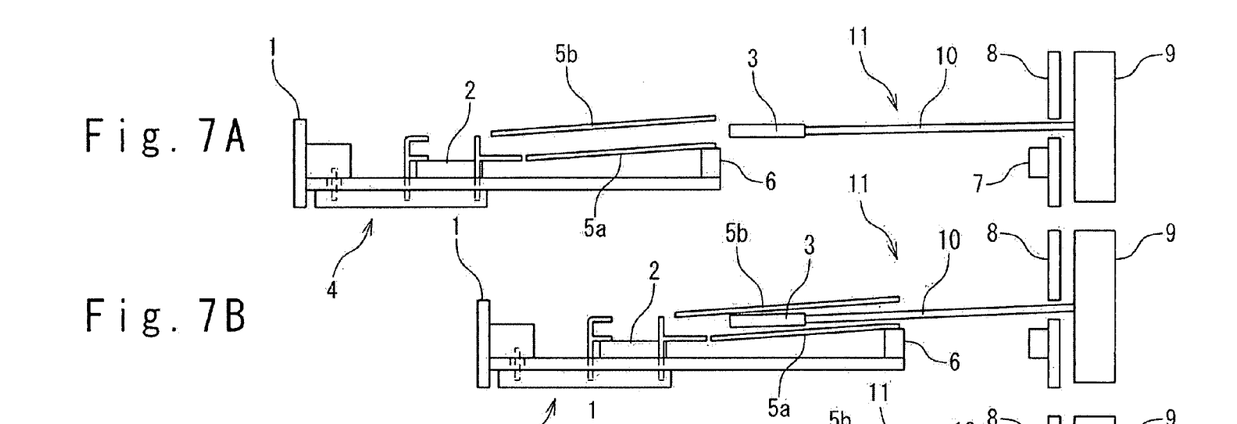
FIGS. 7A to 7D are side views showing a method to insert the information processing blade computer into an information processing apparatus main body of the present invention.

Referring to FIG. 7A, in the slot of the information processing apparatus main body 11, the water passage 10 with a front edge connected with the water-cooling head 3 extends from the back plate 8 toward the back plate 8. The position of the water-cooling head 3 is set such that the water-cooling head 3 comes between guides 5*a* and 5*b* when the information processing blade 1 is inserted into the slot.

Next, referring to FIG. 7B, the information processing blade 1 is inserted into the slot. At this time, the water-cooling head 3 is guided between the guides 5*a* and 5*b*. As the water-cooling head 3 is inserted between the guides 5*a* and 5*b*, the water passage 10 is deformed along the guides 5*a* and 5*b*. Additionally, with respect to the direction vertical to the attached drawing (paper surface), the water passages 10*a* and 10*b* are not substantially deformed, causing little misalignment.

Figures 7C, 7D:
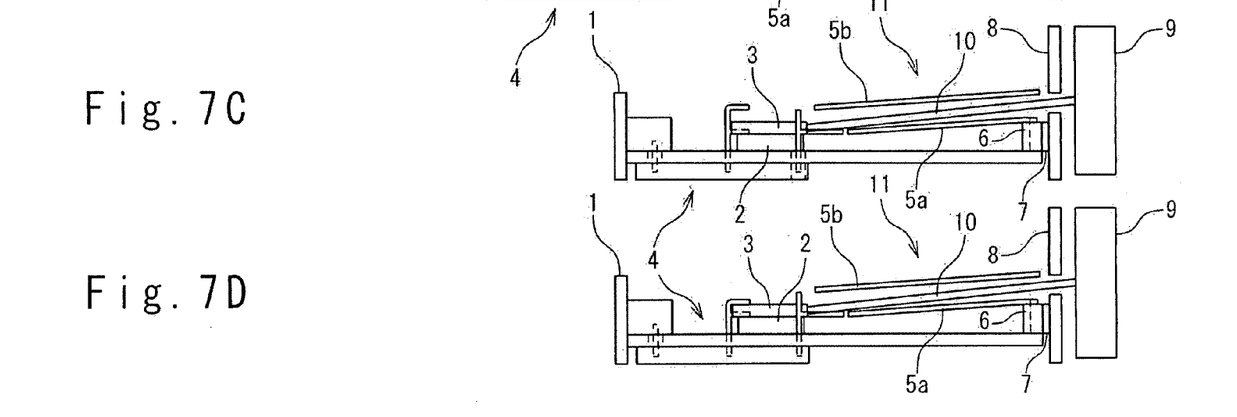

Next, referring to FIG. 7C, the insertion of the information processing blade 1 into the slot is completed by connecting the connectors 6 and 7, and moving the water-cooling head 3 onto the CPU 2. At this time, the fixing terminals 45 do not push the water-cooling head 3. The fixing terminals 45*a* and 45*b* also have the effect of preventing the water-cooling head 3 from being excessively moved. When the fixing terminals 45*a* and 45*b* prevent the excessive movement of the water-cooling head 3, deformation of the water passages 10*a* and 10*b* functions as a buffer against displacement.

Next, referring to FIG. 7D, the water-cooling head fixing mechanism 4 closely fixes the water-cooling head 3 on the CPU 2 by the fixing terminals 45 (45*a* to 45*d*) based on the operation of the operation switch 41. As a result, the water-cooling head 3 is ready to cool the CPU 2. The water-cooling head fixing mechanism 4 stops the suspension of power supply to the circuit 52 on the printed circuit board 1*b*, and instructs the water-cooling system 9 to circulate water. Then, the power is supplied to the circuit 52, and the water circulation between the water-cooling system 9 and the water-cooling head 3 is started.

The information processing blade 1 can be inserted into the information processing apparatus main body 11 in the above way. A method of taking out the information processing blade 1 from the information processing apparatus main body 11 is opposite to the above description, and description of the method is not given.

Figure 8:
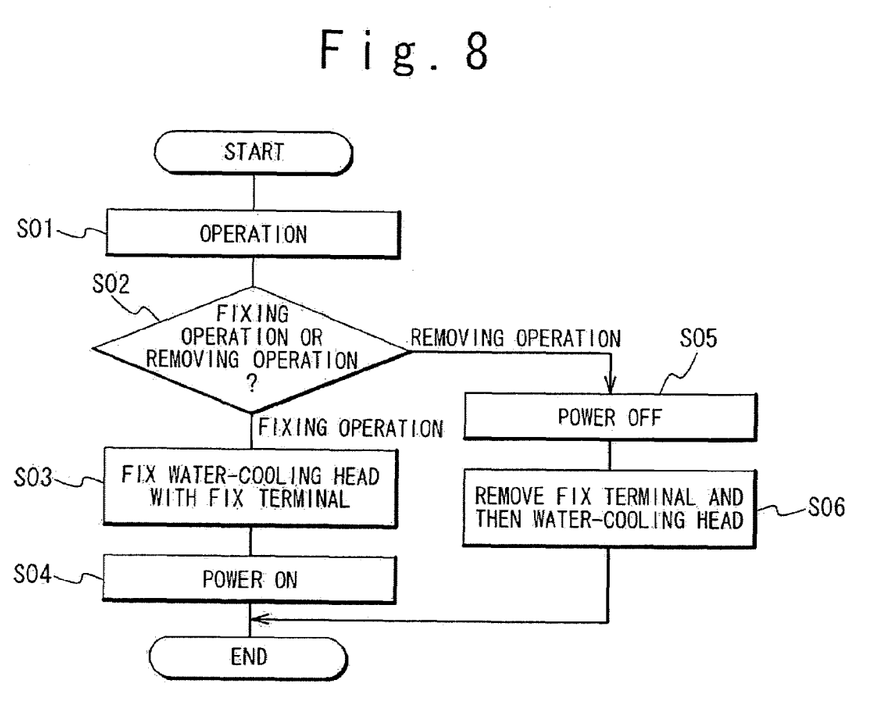
FIG. 8 is a flow chart showing an operation of the water-cooling head fixing mechanism.

Next, an operation of the water-cooling head fixing mechanism 4 will be described with reference to FIGS. 4 and 8. FIG. 8 is a flow chart showing the operation of the water-cooling head fixing mechanism 4.

(1) Step S01

The operation switch 41 is operated by the user, and the operation switch 41 takes either the A state or the B state.

(2) Step S02

The control section 42 determines the state of the operation switch 41 to be either the A state (operation to fix the water-cooling head 3 (operation to take the first state)) or the B state (operation to detach the water-cooling head 3 (operation to take the second state)).

(3) Step S03

In case of the operation to fix the water-cooling head 3 (the A state), the control section 42 outputs the signal 63 indicating the A state to the fixing terminal driving section 44. The fixing terminal driving section 44 drives the driving mechanism (not shown), to lower the fixing terminals 45. Consequently, the water-cooling head 3 is closely fixed on the upper surface of the CPU 2.

(4) Step S04

The control section 42 outputs the signal 61 indicating the A state to the power supply switch 71. Then, the power supply switch 71 is ON, and the power 62 is supplied to the water-cooling system 9. Consequently, the water circulation between the water-cooling system 9 and the water-cooling head 3 is started. As a result, it is possible to supply the power to the circuit 52 including the CPU 2 on the printed circuit board 1*b*.

(5) Step S05

In case of the operation to detach the water-cooling head 3 (the B state), the control section 42 outputs the signal 61 indicating the B state to the power supply switch 71. Then, the power supply switch 71 is OFF, and the supply of the power 62 to the water-cooling system 9 is suspended. Consequently, the water circulation between the water-cooling system 9 and the water-cooling head 3 is suspended. However, before this, the supply of power to the circuit 52 including the CPU 2 on the printed circuit board 1*b* is already suspended.

(6) Step S06

The control section 42 outputs the signal 63 indicating the B state to the fixing terminal driving section 44. The control section 42 drives the driving mechanism (not shown), to raise the fixing terminals 45. Consequently, the water-cooling head 3 is off from (detached from) the upper surface of the CPU 2.

In the above way, the operation of the water-cooling head fixing mechanism 4 is performed, and the water-cooling head 3 is fixed or detached.

Additionally, the operations of the water-cooling head fixing mechanism 4 in FIG. 7D in mounting the water-cooling head 3, are same as the operations of S01 to S04 in FIG. 8. The operation of the water-cooling head fixing mechanism 4 in FIG. 7D when the water-cooling head 3 is taken out, is the operation of S01, S02, S05, and S06 in FIG. 8.

In the above description, the cooling of the CPU 2 is performed. However, the present invention is also applicable to the cooling of other chips and heat-generating members in the information processing blade computer 12. Additionally, only the cooling is performed in the above description. However, it is also possible to set the temperature of chips and members to a desired temperature, by providing the water-cooling system 9 with a temperature adjusting function, to set the temperature of water or other heat mediums to a given temperature. That is, the temperature of desired chips and members can be set to a desired temperature without substantially affecting other members of the information processing blade computer 1, because of the use of a heat medium.

According to the present invention, in an information processing apparatus containing information processing blade computers 12 of a blade structure, cooling is carried out by a water-cooling head having a structure independent of the blade computer, as a mechanism to cool a semiconductor chip that the temperature increases to a high temperature like a CPU. The water-cooling head can be fixed after mounting the blade computer, and detached from the semiconductor chip before taking out the blade computer. Thus, it is possible to insert and remove the information processing blade computer. It is also possible to use a cooling method of water cooling, thereby improving cooling performance. In addition, since there is no need to use a fan for air cooling and a heat sink, the size of the blade computer can be reduced and noise caused by the cooling can be reduced.

What is claimed is:

1. An information processing blade computer comprising:
   a board having a blade structure such that said board is stored in a main body of an information processing apparatus;
   a part contained in a circuit which is mounted on said board to execute a process, wherein heat is generated during an operation of said part; and
   a holding mechanism provided to detachably hold a heat exchange section on said part for heat exchange with said part wherein said holding mechanism comprises a resiliently deformable pushing section configured to slidably move said heat exchange section onto said part in a first positioning direction and a holding section configured to drive said heat exchange section onto said part in a second engaging direction after said heat exchange section has been moved onto said part.

2. The information processing blade computer according to claim 1, wherein said part is a semiconductor chip.

3. The information processing blade computer according to claim 1, wherein said holding mechanism comprises:
   said holding section being operated to separate said heat exchange section from said part and contact said heat exchange section with said part; and
   a hold control section configured to control said holding section.

4. The information processing blade computer according to claim 3, wherein said hold control section controls said pushing section to push said heat exchange section onto said part.

5. The information processing blade computer according to claim 1, further comprising:
   a guide section configured to guide said heat exchange section onto said part.

6. The information processing blade computer according to claim 1, further comprising:
   a control unit which permits supply of power to said circuit when said heat exchange section is held on said part.

7. An information processing apparatus comprising:
   an information processing blade computer;
   a main body configured to store said information processing blade computer;
   a heat exchange section through which a heat medium flows;
   a first pipe supported by said main body, and connected to said heat exchange section to supply said heat medium to said heat exchange section; and
   a second pipe supported by said main body, and connected to said heat exchange section to receive said heat medium from said heat exchange section,
   wherein said information processing blade computer comprises:
     a board having a blade structure;
     a part contained in a circuit which is mounted on said board to execute a process, wherein heat is generated during an operation of said part; and
     a holding mechanism provided to detachably hold said heat exchange section on said part for heat exchange with said part, and said first and second pipes are supported by said main body such that said heat exchange section is at least proximate to said part wherein said holding mechanism comprises a resiliently deformable pushing section configured to slidably move said heat exchange section onto said part in a first positioning direction and a holding section configured to drive said heat exchange section onto said part in a second engaging direction after said heat exchange section has been moved onto said part.

8. The information processing apparatus according to claim 7, further comprising:
   a radiating section connected with said first and second pipes and configured to irradiate heat of said heat medium and to supply to said heat exchange section said heat medium from which said heat is irradiated.

9. The information processing apparatus according to claim 7, wherein said part is a semiconductor chip.

10. The information processing apparatus according to claim 7, wherein said holding mechanism comprises:
    said holding section being operated to separate said heat exchange section from said part and contact said heat exchange section with said part;
    and a hold control section configured to control said holding section.

11. The information processing apparatus according to claim 10, wherein said hold control section controls said pushing section to push said heat exchange section onto said part.

12. The information processing apparatus according to claim 7, further comprising:
    a guide section configured to guide said heat exchange section onto said part.

13. The information processing apparatus according to claim 7, further comprising:
    a control unit permits supply of power to said circuit when said heat exchange section is held on said part.

14. A method of cooling a part of a circuit in an information processing blade computer, comprising:
    supporting a heat exchange section by first and second pipes, wherein heat medium flows through said heat exchange section, said heat medium is supplied to said heat exchange section through said first pipe, and said heat medium is supplied from said heat exchange section through said second pipe;
    storing said information processing blade computer in a main body;
    slidably guiding said heat exchange section in a first positioning direction onto said part and driving said heat exchange section onto said part in a second engaging direction after said heat exchange section has been moved onto said part, while said information processing blade computer is stored in said main body; and
    holding said heat exchange section onto said part for heat exchange with said part.

15. The method according to claim 14, further comprising:
    radiating heat of said heat medium; and
    supplying to said heat exchange section said heat medium from which said heat is irradiated.

16. The method according to claim 14, further comprising:
    permitting supply of power to said circuit when said heat exchange section is held on said part.

17. The method according to claim 16, further comprising:
    stopping the supply of power to said circuit when said heat exchange section is separated from said part.

* * * * *